United States Patent
Goh et al.

(10) Patent No.: US 12,148,674 B2
(45) Date of Patent: Nov. 19, 2024

(54) SUBSTRATE PROCESSING CONTROL USING A MEASURED SIZE DISTRIBUTION OF BY-PRODUCT PARTICLES

(71) Applicant: SEMES CO., LTD., Cheonan-si (KR)

(72) Inventors: Jung Suk Goh, Hwaseong-si (KR); Young Dae Chung, Incheon (KR); Ji Hoon Jeong, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 420 days.

(21) Appl. No.: 17/224,658

(22) Filed: Apr. 7, 2021

(65) Prior Publication Data

US 2021/0313239 A1 Oct. 7, 2021

(30) Foreign Application Priority Data

Apr. 7, 2020 (KR) .................. 10-2020-0042396

(51) Int. Cl.
*H01L 21/66* (2006.01)
*H01L 21/311* (2006.01)

(52) U.S. Cl.
CPC ........ *H01L 22/26* (2013.01); *H01L 21/31111* (2013.01)

(58) Field of Classification Search
CPC ............... H01L 22/26; H01L 21/31111; H01L 21/6708; H01L 21/67253; H01L 22/12; H01L 22/20; H01L 21/0217; H01L 21/67098; H01L 21/68764

See application file for complete search history.

(56) References Cited

U.S. PATENT DOCUMENTS

| | | | |
|---|---|---|---|
| 2010/0154826 A1* | 6/2010 | Printz | H01L 21/67028 134/18 |
| 2014/0231012 A1* | 8/2014 | Hinode | H01L 21/67103 156/345.23 |
| 2015/0307819 A1* | 10/2015 | Ida | H01L 21/31111 510/175 |
| 2019/0143481 A1* | 5/2019 | Wang | H01L 21/02052 134/113 |

* cited by examiner

*Primary Examiner* — Jami Valentine Miller
*Assistant Examiner* — Zhijun Xu
(74) *Attorney, Agent, or Firm* — KILE PARK REED & HOUTTEMAN PLLC

(57) ABSTRACT

A substrate processing method and a substrate processing apparatus for removing material on a substrate are disclosed. In order to remove the material, a processing liquid including a chemical liquid and water is supplied on the substrate so that a liquid layer maintained by surface tension is formed. The material is removed from the substrate by a reaction between the material and the processing liquid. A size distribution of by-product particles formed by the reaction between the material and the processing liquid is measured by a dynamic light scattering method. A supply of the processing liquid is controlled based on the size distribution of the by-product particles.

10 Claims, 7 Drawing Sheets

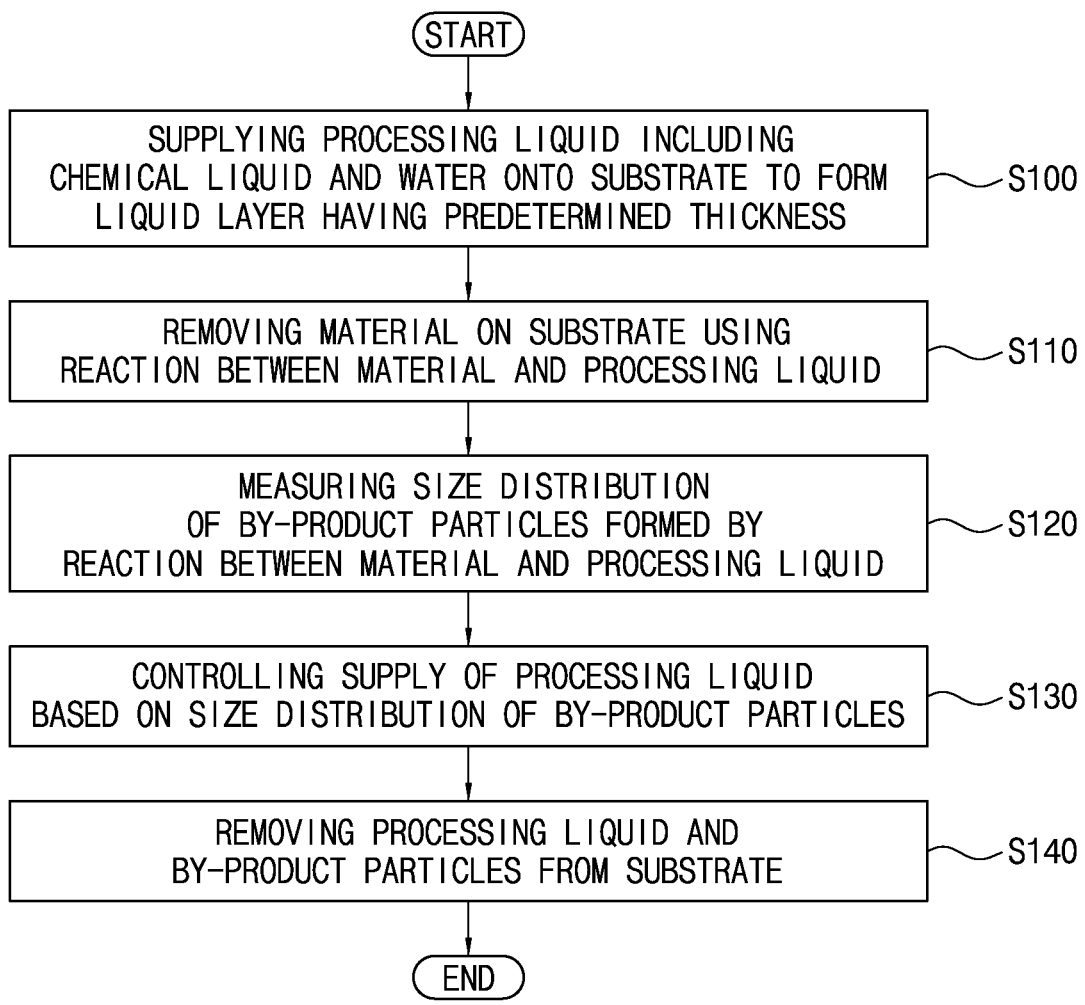

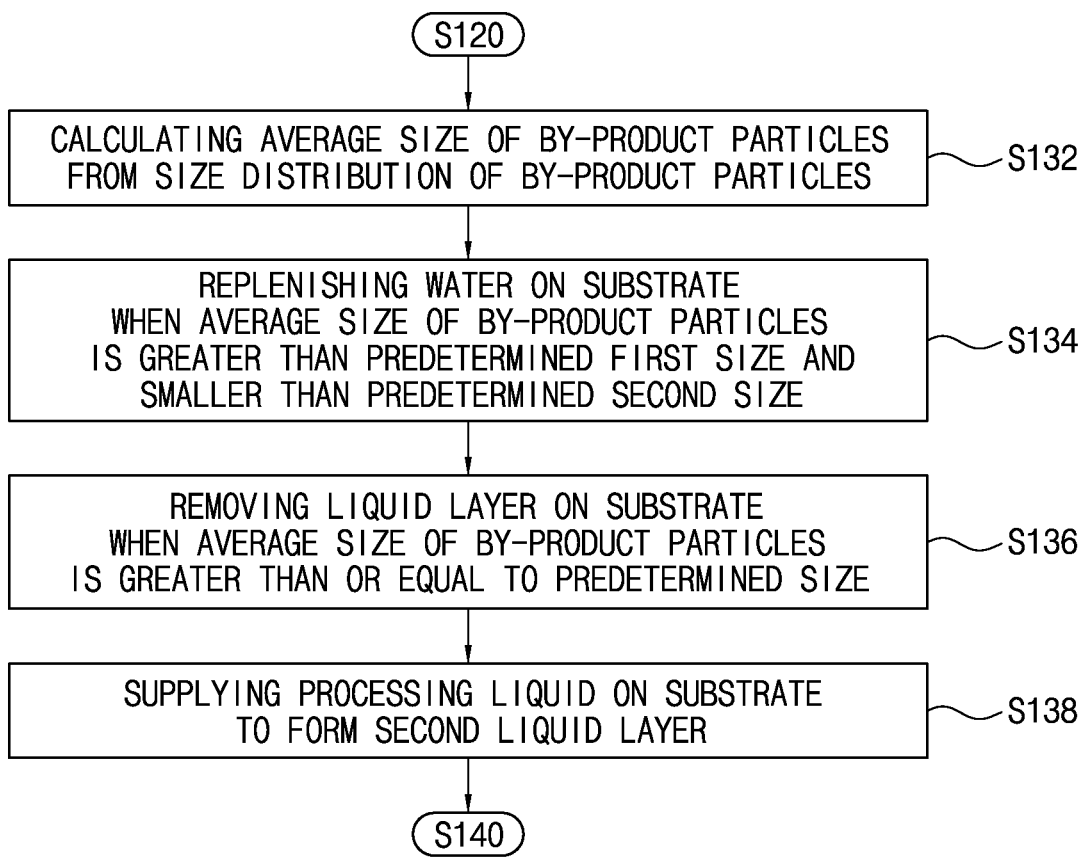

SUBSTRATE PROCESSING CONTROL USING A MEASURED SIZE DISTRIBUTION OF BY-PRODUCT PARTICLES

CROSS-REFERENCE TO RELATED APPLICATION

This application claims the priority benefit of Korean Patent Application No. 10-2020-0042396, filed on Apr. 7, 2020, and all the benefits accruing therefrom under 35 U.S.C. § 119, the contents of which are incorporated by reference in their entirety.

TECHNICAL FIELD

The present disclosure relates to a substrate processing method and a substrate processing apparatus. More particularly, the present disclosure relates to a substrate processing method and a substrate processing apparatus for removing material on a substrate such as a silicon wafer.

BACKGROUND

In general, semiconductor devices may be manufactured by repeatedly performing a series of manufacturing processes on a silicon wafer used as a substrate. For example, a deposition process for forming a thin layer on a substrate, a photolithography process for forming a photoresist pattern on the thin layer, an etching process for patterning or removing the thin layer, and the like may be performed.

An etching process for removing material on a substrate is classified into a dry etching process and a wet etching process. The wet etching process is classified into a single wafer type configured to process substrates piece by piece and a batch type configured to simultaneously process a plurality of substrates. A single wafer type etching apparatus may supply a processing liquid, for example, an etchant for removing the material onto the substrate while rotating the substrate. The thin layer may be removed through a reaction between the thin layer and the processing liquid, and reaction by-products generated by the reaction and remaining processing liquid may be removed from the substrate by rotating the substrate.

For example, when a silicon nitride layer is formed on the substrate, the silicon nitride layer may be removed by a processing liquid including phosphoric acid and water. In such case, in order to increase a reaction speed between the silicon nitride layer and the processing liquid, the processing liquid may be heated and then be supplied on a central portion of the substrate. The processing liquid may spread from the central portion of the substrate toward an edge portion of the substrate by the rotation of the substrate, and reaction by-products and the processing liquid may be removed from the substrate by centrifugal force. However, in the case of the etching process of the single water type as described above, there is a problem that a relatively large amount of the processing liquid is required and the use efficiency of the processing liquid is poor.

SUMMARY

The embodiments of the present invention provide a substrate processing method and a substrate processing apparatus capable of reducing an amount of a processing liquid used to remove a material on a substrate.

In accordance with an aspect of the present invention, a substrate processing method may include supplying a processing liquid including a chemical liquid and water on a substrate in order to remove a material on the substrate so that a liquid layer maintained by surface tension is formed on the substrate, removing the material from the substrate using a reaction between the material and the processing liquid, measuring a size distribution of by-product particles formed by the reaction between the material and the processing liquid, and controlling a supply of the processing liquid based on the size distribution of the by-product particles.

In accordance with some embodiments of the present invention, the size distribution of the by-product particles may be measured by dynamic light scattering.

In accordance with some embodiments of the present invention, the controlling the supply of the processing liquid may include calculating an average size of the by-product particles from the size distribution of the by-product particles, removing the liquid layer on the substrate when the average size of the by-product particles is greater than or equal to a predetermined size, and supplying the processing liquid on the substrate to form a second liquid layer.

In accordance with some embodiments of the present invention, the controlling the supply of the processing liquid may include calculating an average size of the by-product particles from the size distribution of the by-product particles, and replenishing the water on the substrate when the average size of the by-product particles is greater than a predetermined first size and smaller than a predetermined second size.

In accordance with some embodiments of the present invention, the controlling the supply of the processing liquid may further include measuring a thickness of the liquid layer, and the water may be replenished so that the thickness of the liquid layer becomes a predetermined thickness.

In accordance with some embodiments of the present invention, the substrate may be rotated at a first speed within a range in which the liquid layer is maintained while removing the material.

In accordance with some embodiments of the present invention, the substrate may be rotated within a range in which the liquid layer is maintained while removing the material, and a rotational speed of the substrate may repeat acceleration and deceleration between a first speed and a second speed.

In accordance with some embodiments of the present invention, the substrate processing method may further include heating the processing liquid to a predetermined first temperature and heating the substrate to a predetermined second temperature. In such case, the processing liquid heated to the first temperature may be supplied onto the substrate heated to the second temperature.

In accordance with some embodiments of the present invention, the substrate processing method may further include heating the substrate to a predetermined third temperature after the processing liquid is supplied onto the substrate.

In accordance with some embodiments of the present invention, the controlling the supply of the processing liquid may include calculating an average size of the by-product particles from the size distribution of the by-product particles, cooling the substrate to the second temperature when the average size of the by-product particles is greater than or equal to a predetermined size, rotating the substrate so that the liquid layer on the substrate is removed, and supplying the processing liquid on the substrate to form a second liquid layer.

In accordance with some embodiments of the present invention, the controlling the supply of the processing liquid may include calculating an average size of the by-product particles from the size distribution of the by-product particles, cooling the substrate to a temperature lower than a boiling point of the water when the average size of the by-product particles is greater than a predetermined first size and smaller than a predetermined second size, and replenishing the water on the substrate.

In accordance with some embodiments of the present invention, the substrate may be rotated at a first speed within a range in which the liquid layer is maintained while the water is replenished.

In accordance with some embodiments of the present invention, the substrate may be rotated within a range in which the liquid layer is maintained while the water is replenished, and a rotational speed of the substrate may repeat acceleration and deceleration between a first speed and a second speed.

In accordance with another aspect of the present invention, a substrate processing apparatus may include a processing liquid supply section configured to supply a processing liquid including a chemical liquid and water on a substrate in order to remove a material on the substrate so that a liquid layer maintained by surface tension is formed on the substrate, a measurement unit configured to measure a size distribution of by-product particles formed by a reaction between the material and the processing liquid, and a control unit configured to control a supply of the processing liquid based on the size distribution of the by-product particles.

In accordance with some embodiments of the present invention, the measurement unit may measure the size distribution of the by-product particles using dynamic light scattering.

In accordance with some embodiments of the present invention, the substrate processing apparatus may further include a support unit configured to support the substrate and a rotation driving section configured to rotate the support unit.

In accordance with some embodiments of the present invention, the control unit may calculate an average size of the by-product particles from the size distribution of the by-product particles, control operations of the rotation driving section so that the liquid layer is removed by rotating the substrate when the average size of the by-product particles is greater than or equal to a predetermined size, and control operations of the processing liquid supply section so that a second liquid layer is formed by supplying the processing liquid on the substrate.

In accordance with some embodiments of the present invention, the substrate processing apparatus may further include a water supply section configured to supply the water on the substrate.

In accordance with some embodiments of the present invention, the control unit may calculate an average size of the by-product particles from the size distribution of the by-product particles, and control operations of the water supply section so that the water is supplied on the substrate when the average size of the by-product particles is greater than a predetermined first size and smaller than a predetermined second size.

In accordance with some embodiments of the present invention, the substrate processing apparatus may further include a second measurement unit configured to measure a thickness of the liquid layer.

In accordance with some embodiments of the present invention, the control unit may control operations of the water supply section so that the thickness of the liquid layer becomes a predetermined thickness.

In accordance with some embodiments of the present invention, the substrate processing apparatus may further include a heater configured to heat the substrate and a substrate cooling section configured to cool the substrate.

In accordance with the embodiments of the present invention, the processing liquid supply section may supply the processing liquid on the substrate to form a liquid layer having a predetermined thickness, and the material on the substrate may be removed from the substrate by reaction with the processing liquid. As described above, an etching process on the material may be performed in a puddle method, and the amount of use of the processing liquid may thus be significantly reduced. In particular, the supply of the processing liquid may be controlled based on the size distribution of the by-product particles formed in the liquid layer as the etching process on the material is performed, and the etch uniformity for the material may thus be significantly improved.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which:

FIG. 6 is a flow chart illustrating a substrate processing method using the substrate processing apparatus as shown in FIG. 1; and FIG. 7 is a flow chart illustrating step S130 as shown in FIG. 6.

Figure 1:
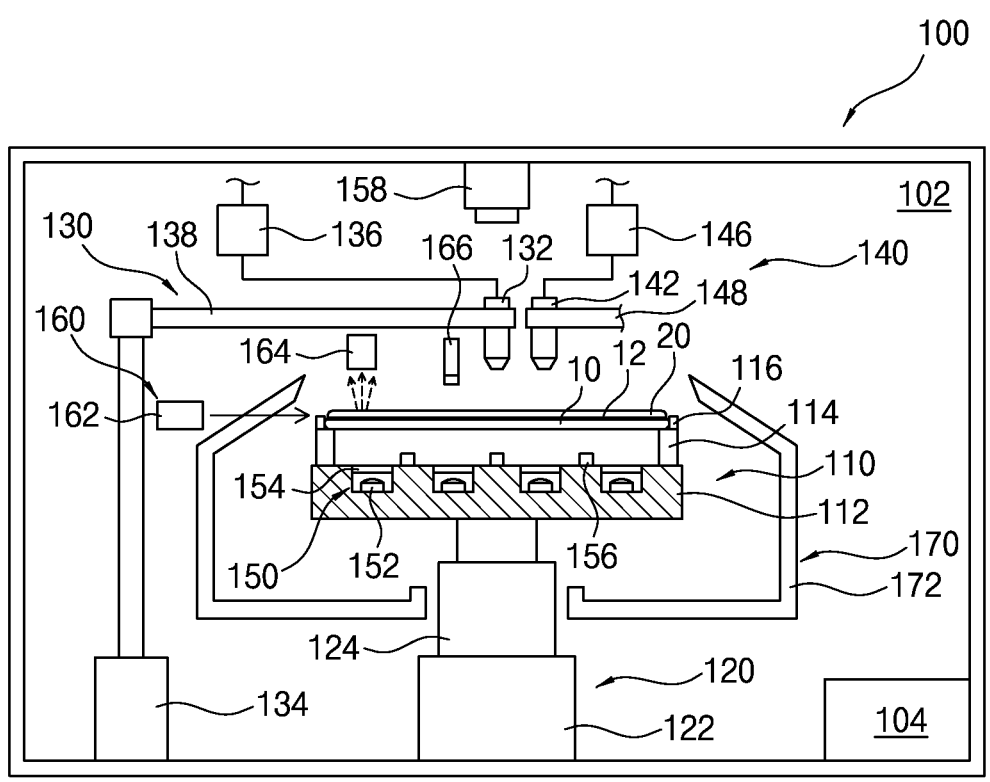
FIG. 1 is a schematic view illustrating a substrate processing apparatus in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
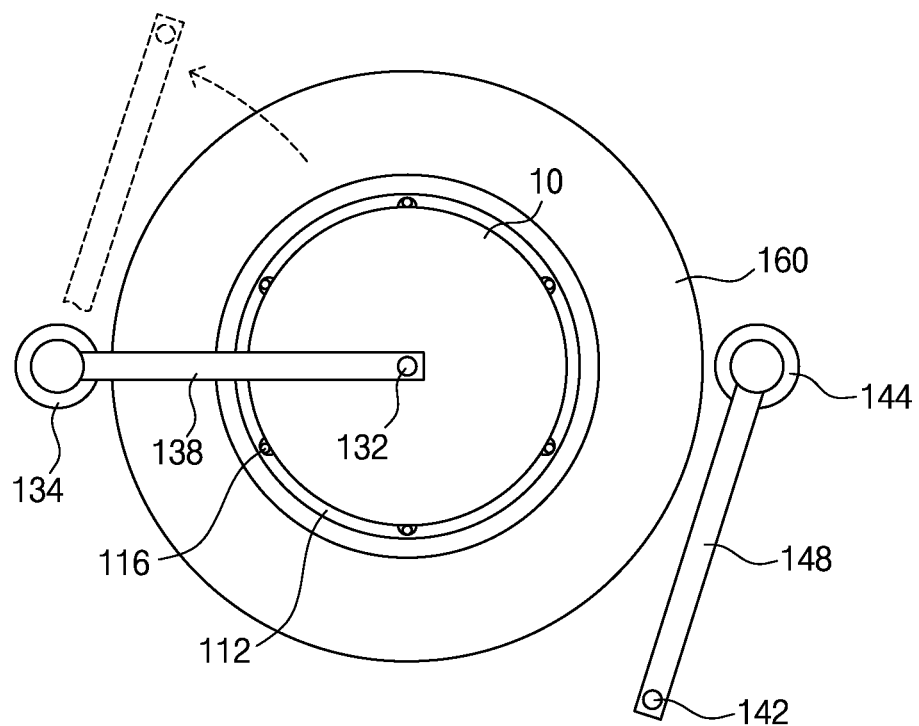
FIG. 2 is a plan view illustrating a processing liquid supply section and a water supply section as shown in FIG. 1.

FIG. 1 is a schematic view illustrating a substrate processing apparatus in accordance with an embodiment of the present invention, and FIG. 2 is a plan view illustrating a processing liquid supply section and a water supply section as shown in FIG. 1.

Referring to FIGS. 1 and 2, a substrate processing apparatus 100 according to an embodiment of the present invention may be used to remove a material formed on a substrate 10 such as a silicon wafer. For example, the substrate processing apparatus 100 may be used to remove a thin layer 12 including silicon nitride ($Si_3N_4$) formed on the substrate 10. A processing liquid 20 including a chemical liquid and water may be supplied on the substrate 10, and the thin layer 12 may be removed by an etching reaction between the thin layer 12 and the processing liquid 20. For example, a processing liquid 20 including phosphoric acid ($H_3PO_4$) and water ($H_2O$) may be supplied on the substrate 10.

In accordance with an embodiment of the present invention, the substrate processing apparatus 100 may include a process chamber 102 in which an etching process for removing the thin layer 12 is performed. A support unit 110 for supporting the substrate 10 and a rotation driving section 120 for rotating the support unit 110 may be disposed in the process chamber 102.

For example, the support unit 110 may include a support head 112 having a substantially circular plate shape and a plurality of support pins 114 disposed on the support head 112 to support edge portions of the substrate 10. The support head 112 may have a disk shape, and the support pins 114 may be disposed on edge portions of the support head 112 at regular intervals to support the edge portions of the substrate 10. Support members 116 for supporting side portions of the substrate 10 may be respectively disposed on the support pins 114 while the substrate 10 is rotated by the rotation driving section 120. The rotation driving section 120 may include a driving unit 122 disposed under the support head 112 and including a motor for providing rotational force, and a driving shaft 124 connecting between the driving unit 122 and the support head 112.

The substrate processing apparatus 100 may include a processing liquid supply section 130 that supplies the processing liquid 20 onto the substrate 10 to remove the thin layer 12. For example, the processing liquid supply section 130 may include a processing liquid supply nozzle 132 for supplying the processing liquid 20 on a central portion of the substrate 10, a nozzle driving unit 134 for moving the processing liquid supply nozzle 132 in a horizontal direction, and a processing liquid heating unit 136 for heating the processing liquid 20 to a predetermined temperature.

Meanwhile, the thin layer 12 including the silicon nitride may be removed by a chemical reaction between the silicon nitride and the processing liquid 20 including phosphoric acid and water. Reaction formula between the thin layer 12 and the processing liquid 20 is as follows.

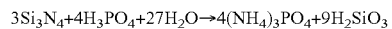

$$3Si_3N_4+4H_3PO_4+27H_2O \rightarrow 4(NH_4)_3PO_4+9H_2SiO_3$$

In the above chemical reaction, a reaction speed may be increased by a temperature of the processing liquid 20. In order to increase an etching rate of the thin layer 12, the processing liquid heating unit 136 may heat the processing liquid 20 to a temperature equal to or lower than a boiling point of the processing liquid 20, for example, to a first temperature of about 120° C. to about 150° C., and the processing liquid 20 heated to the first temperature may then be supplied onto the substrate 10.

In accordance with an embodiment of the present invention, the etching process on the thin layer 12 may be performed in a puddle method to reduce the amount of the processing liquid 20 used. In particular, the processing liquid supply section 130 may supply the processing liquid 20 in a predetermined amount on a central portion of the substrate 10, and the rotation driving section 120 may rotate the substrate 10 at a low speed to entirely spread the processing liquid 20 on an upper surface of the substrate 10 so as to form a liquid layer of a predetermined thickness thereon. That is, the processing liquid 20 supplied on the substrate 10 may spread from the central portion of the substrate 10 toward the edge portion of the substrate 10 by centrifugal force. After the processing liquid 20 sufficiently spreads toward the edge portion of the substrate 10, the processing liquid 20 may form the liquid layer at a predetermined thickness by surface tension. As described above, after forming the liquid layer, the etching process for the thin layer 12 may be performed for a predetermined time by the processing liquid 20.

The substrate processing apparatus 100 may include a heater 150 for heating the substrate 10. For example, the heater 150 may include a plurality of infrared lamps 152 disposed in the support head 112, and the support head 112 may include a plurality of quartz windows 154 for transmitting infrared lights irradiated from the infrared lamps 152 towards a lower surface of the substrate 10.

The heater 150 may heat the substrate 10 to a predetermined second temperature, and the processing liquid 20 may be supplied onto the substrate 10 heated to the second temperature. For example, the heater 150 may heat the substrate 10 to a temperature equal to the temperature of the processing liquid 20, for example, to a second temperature of about 120° C. to about 150° C. Further, the heater 150 may heat the substrate 10 to a predetermined third temperature, for example, to a temperature of about 200° C. to about 250° C. so as to increase the etching rate of the thin layer 12.

The rotation driving section 120 may rotate the substrate 10 at a first speed, for example, at a speed of several to several hundred RPM within a range in which the liquid layer is maintained by surface tension so as to accelerate the reaction between the processing liquid 20 and the material while the processing liquid 20 is supplied and while the etching process is performed. As another example, the rotation driving section 120 may rotate the substrate 10 within a range in which the liquid layer is maintained by surface tension after the processing liquid 20 is supplied. In such case, a rotational speed of the substrate 10 may repeat acceleration and deceleration between a first speed and a second speed.

The material on the substrate 10, that is, the thin layer 12 may be removed by the reaction between the processing liquid 20 and the material, and by-product particles may be formed in the liquid layer by the reaction between the processing liquid 20 and the material. In accordance with an embodiment of the present invention, the substrate processing apparatus 100 may include a first measurement unit 160 for measuring a size distribution of the by-product particles. For example, the first measurement unit 160 may measure the size distribution of the by-product particles in the liquid layer using Dynamic Light Scattering (DLS), and may include a laser irradiation part 162 for irradiating a laser beam toward the liquid layer and a light detection part 164 for detecting light scattered by the by-product particles in the liquid layer.

The size of the by-product particles may be gradually increased by the reaction between the processing liquid 20 and the material as the etching process proceeds, that is, as time elapses after the processing liquid 20 is supplied onto the substrate 10. In accordance with an embodiment of the present invention, the substrate processing apparatus 100 may include a control unit 104 for controlling a supply of the processing liquid 20 based on the size distribution of the by-product particles.

The control unit 104 may calculate an average size of the by-product particles from the size distribution of the by-product particles. The control unit 104 may remove the liquid layer on the substrate 10 when the average size of the by-product particles is greater than or equal to a predetermined size, for example, when the average size of the by-product particles is several μm or more. Then, the control unit 104 may supply the processing liquid 20 onto the substrate 10 to form a second liquid layer. For example, the rotation driving section 120 may rotate the substrate 10 at high speed so that the liquid layer on the substrate 10 is removed by centrifugal force, and the processing liquid supply section 130 may supply the processing liquid 20 to form the second liquid layer. In such case, the control unit 104 may control operations of the rotation driving section 120 and the processing liquid supply section 130 to remove the liquid layer and to form the second liquid layer.

The substrate processing apparatus 100 may include a substrate cooling section 156 for cooling the substrate 10. For example, the substrate cooling section 156 may include gas injection nozzles disposed on the support head 112 to inject a cooling gas, for example, dry air onto the lower surface of the substrate 10. A temperature measuring unit 158 for measuring the temperature of the substrate 10, for example, a thermal imaging camera, may be disposed above the substrate 10. The substrate cooling section 156 may cool the substrate 10 to the second temperature to form the second liquid layer, and the processing liquid 20 may be supplied onto the substrate 10 cooled to the second temperature.

In accordance with an embodiment of the present invention, the substrate processing apparatus 100 may include a second measurement unit 166 that measures a thickness of the liquid layer and detects a change in the thickness of the liquid layer while etching the thin layer 12 by using the reaction between the thin layer 12 and the processing liquid 20. For example, the second measurement unit 166 may be disposed above the substrate 10, and although not shown in figures, may include a light irradiating part for irradiating light onto the substrate 10 and a light receiving part for receiving light reflected from the substrate 10 after being refracted by the liquid layer.

Meanwhile, the concentration of phosphoric acid and water may change due to dehydration caused by the reaction of the silicon nitride with phosphoric acid and water. That is, because the amount of water consumed in the etching reaction is relatively greater than that of the phosphoric acid, the concentration of the phosphoric acid and water may be changed as the etching reaction proceeds. In accordance with an embodiment of the present invention, the substrate processing apparatus 100 may include a water supply section 140 for supplying water, for example, deionized water, on the substrate 10, and the control unit 104 may control operations of the water supply section 140. For example, the water supply section 140 may include a water supply nozzle 142 for supplying the water on the central portion of the substrate 10, a second nozzle driving unit 144 (shown in FIG. 2) for moving the water supply nozzle 142 in a horizontal direction, and a water heating unit 146 for heating the water at a predetermined temperature.

For example, when the average size of the by-product particles is within a predetermined range, the control unit 104 may replenish the water on the substrate 10 so that the thickness of the liquid layer becomes a predetermined thickness. That is, when the average size of the by-product particles is greater than a predetermined first size and smaller than a predetermined second size, for example, when the average size of the by-product particles is more than a few hundred nm and less than several μm, the water may be supplied on the substrate 10, and the control unit 104 may control operations of the water supply section 140 so that the thickness of the liquid layer becomes the predetermined thickness.

When the water is supplied on the substrate 10, the water may be evaporated while supplying the water if the temperature of the substrate 10 is higher than the boiling point of the water. In accordance with an embodiment of the present invention, in order to prevent the evaporation of the water, the substrate cooling section 156 may cool the substrate 10 to a temperature of less than the boiling point of the water, that is, 100° C., for example, to a temperature of about 90° C. to about 99° C. A water heating unit 146 may heat the water to be supplied onto the substrate 10 to the same temperature as the substrate 10, that is, to a temperature of less than 100° C., for example, to a temperature of about 90° C. to about 99° C., and the heater 150 may heat the substrate 10 again to the third temperature after the water is supplied.

Alternatively, the control unit 104 may calculate a variation in the concentration of the phosphoric acid and water based on the variation in the thickness of the liquid layer, and may supply the water on the substrate 10 based on the variation in the concentration of the phosphoric acid and water so that the concentration of the phosphoric acid and water becomes a predetermined value. In such case, the second measurement unit 166 may secondly measure the thickness of the liquid layer after the water is supplied, and the processing liquid supply section 130 may secondly supply the processing liquid 20 on the substrate 10 so that the thickness of the liquid layer becomes a predetermined value. As a result, the liquid layer on the substrate 10 may maintains a constant concentration and a constant thickness by the supply of the water and the second supply of the processing liquid 20. Thus, the etching process on the thin layer 12 may be more uniformly performed on entire of the substrate 10.

The rotation driving section 120 may rotate the substrate 10 at a first speed, for example, at a speed of several to several hundred RPM within a range in which the liquid layer is maintained in order to mix the processing liquid and the water on the substrate 10 while replenishing the water. As another example, the rotation driving section 120 may rotate the substrate 10 within a range in which the liquid layer is maintained by surface tension while replenishing the water, and the control unit 104 may control operations of the rotation driving section 120 so that a rotational speed of the substrate 10 repeats acceleration and deceleration between a first speed and a second speed. As described above, when the rotational speed of the substrate 10 is continuously changed through the acceleration and deceleration, the by-product particles in the liquid layer may be prevented from adhering to the substrate 10.

The nozzle driving unit 134 may be connected to the processing liquid supply nozzle 132 by a nozzle arm 138. The nozzle driving unit 134 may rotate the nozzle arm 138 so that the processing liquid supply nozzle 132 is disposed above the central portion of the substrate 10. The nozzle driving unit 134 may rotate the nozzle arm 138 so that the processing liquid supply nozzle 132 is spaced apart from the substrate 10 after the processing liquid 20 is supplied onto the substrate 10. The second nozzle driving unit 144 may be connected to the water supply nozzle 142 by a second nozzle arm 148, and may rotate the second nozzle arm 148 so that the water supply nozzle 142 is disposed above the central portion of the substrate 10. The second nozzle driving unit 144 may rotate the second nozzle arm 148 so that the water supply nozzle 142 is spaced apart from the substrate 10 for a subsequent step of supplying the processing liquid 20.

Further, the substrate processing apparatus 100 may include a bowl unit 170 configured to surround the substrate 10 to collect the processing liquid 20. For example, in order to remove the reaction by-products and remaining processing liquid on the substrate 10 after the etching process is performed, the rotation driving section 120 may rotate the substrate 10 at a high speed, and the reaction by-products and the remaining processing liquid may be removed from the substrate 10 by centrifugal force. The reaction by-products and the remaining processing liquid removed from the substrate 10 may be collected by the bowl unit 170, and may be discharged through a discharge pipe (not shown) connected to the bowl unit 170.

As shown in FIG. 1, the bowl unit 170 includes one bowl 172. However, as another example, the bowl unit 170 may include a plurality of bowls. For example, after the etching process is performed, a rinsing process for removing etch residues from the substrate 10 and a drying process for drying the substrate 10 may be performed. In such case, the bowl unit 170 may further include a second bowl (not shown) configured to collect a rinsing liquid, for example, deionized water used for the rinsing process, and a third bowl (not shown) configured to collect a drying liquid, for example, isopropyl alcohol used for the drying process. Also, although not shown in figure, the substrate processing apparatus 100 may further include a rinsing liquid supply section for supplying the rinsing liquid and a drying liquid supply section for supplying the drying liquid.

Meanwhile, the laser irradiation part 162 of the first measurement unit 160 may be disposed outside the bowl unit 170, and the laser beam may pass through the bowl unit 170 and be irradiated to the liquid layer as shown in FIG. 1. In such case, the bowl 172 may be made of a light-transmitting material such as PFA (Perfluoroalkoxy), and the light detection part 164 of the first measurement unit 160 may be disposed above the substrate 10 to detect the light scattered by the by-product particles.

Figure 3:
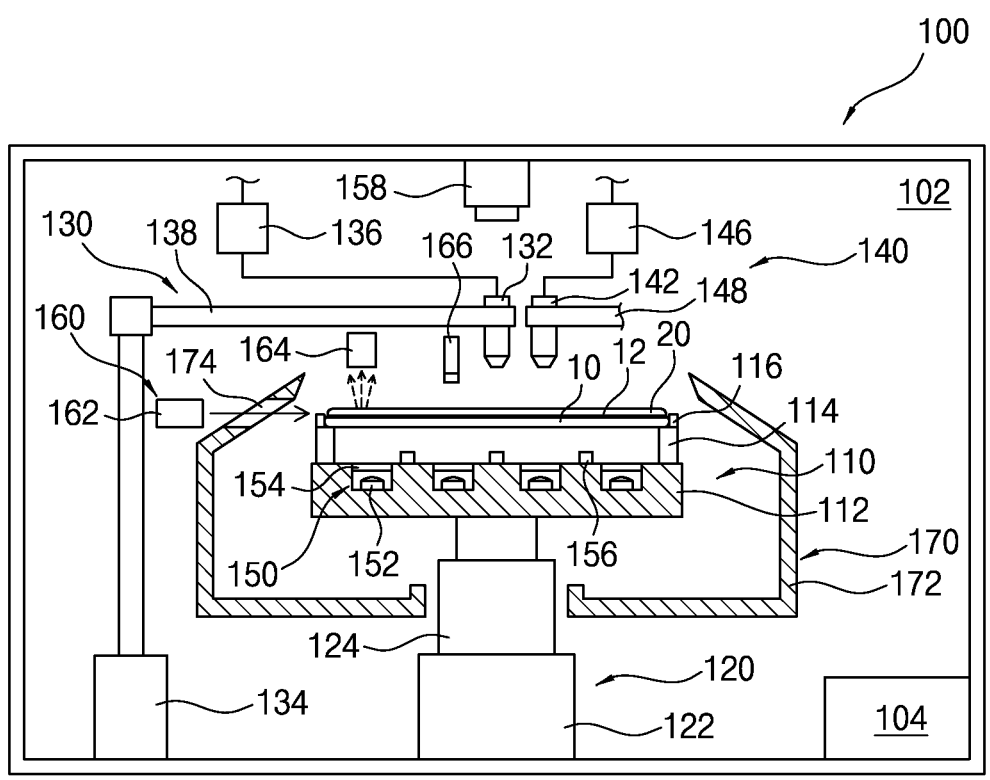
FIG. 3 is a schematic view illustrating another example of the bowl unit as shown in FIG. 1.
Figure 4:
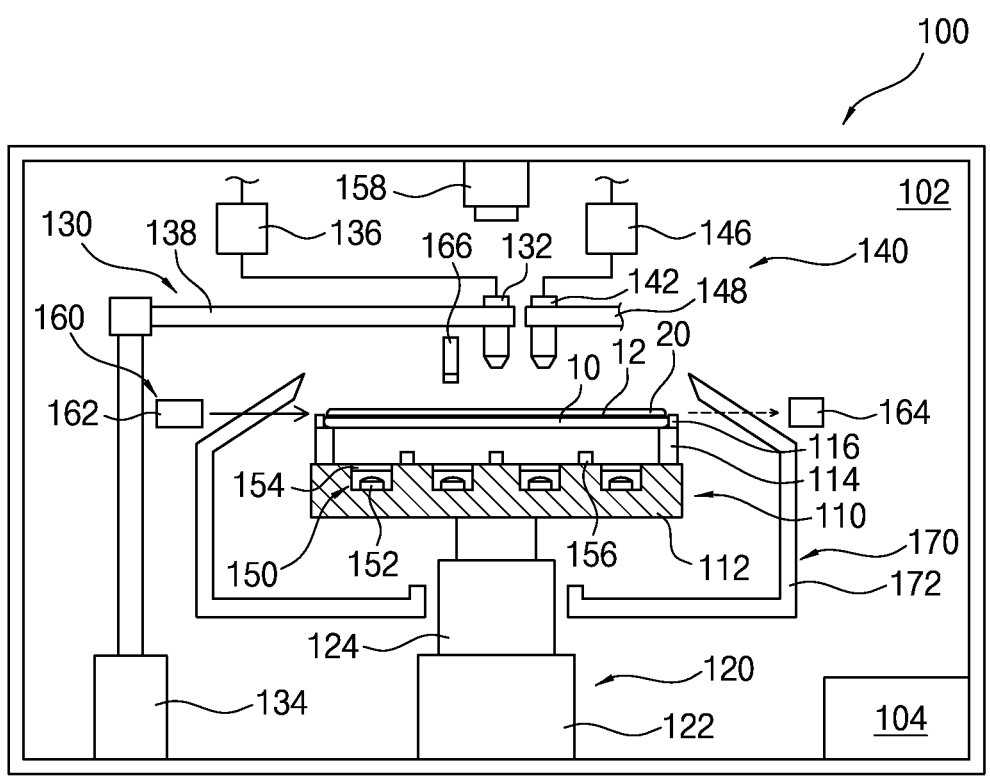
FIGS. 4 and 5 are schematic views illustrating other examples of the first measurement unit as shown in FIG. 1.
Figure 5:
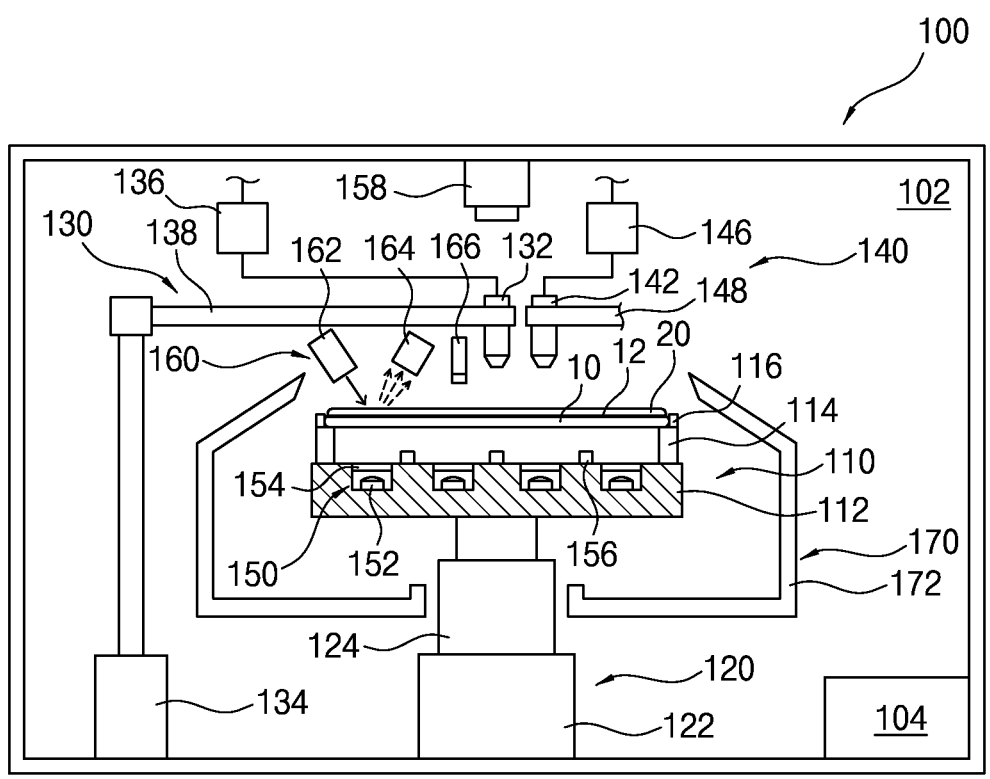

FIG. 3 is a schematic view illustrating another example of the bowl unit as shown in FIG. 1, and FIGS. 4 and 5 are schematic views illustrating other examples of the first measurement unit as shown in FIG. 1.

Referring to FIG. 3, the bowl unit 170 may include a bowl 172 disposed to surround the substrate 10. The bowl unit 170 may include a transparent window 174 for passing the laser beam between the laser irradiation part 162 and the liquid layer. For example, the transparent window 174 may be made of a light-transmitting material such as quartz.

Referring to FIG. 4, the first measurement unit 160 may include a laser irradiation part 162 and a light detection part 164 respectively disposed on both sides of the bowl unit 170. In this case, the bowl 172 may be made of a light-transmitting material capable of transmitting a laser beam and light scattered by the by-product particles.

Referring to FIG. 5, the first measurement unit 160 may include a laser irradiation part 162 and a light detection part 164 disposed above the substrate 10. The laser irradiation part 162 may irradiate a laser beam toward the liquid layer, and the light detection part 164 may detect light scattered by the by-product particles.

FIG. 6 is a flow chart illustrating a substrate processing method using the substrate processing apparatus as shown in FIG. 1, and FIG. 7 is a flow chart illustrating step S130 as shown in FIG. 6.

Referring to FIGS. 6 and 7, in step S100, a processing liquid 20 including a chemical liquid and water may be supplied onto a substrate 10 so that a liquid layer having a predetermined thickness is formed on the substrate 10. The processing liquid 20 may be supplied by a processing liquid supply section 130 in a predetermined amount onto a central portion of the substrate 10. Further, the processing liquid 20 may be heated to a predetermined first temperature by a processing liquid heating unit 136 before being supplied onto the substrate 10. For example, the processing liquid 20 may be heated to a temperature of about 120° C. to about 150° C. by the processing liquid heating unit 136. Still further, the substrate 10 may be heated to a predetermined second temperature, for example, to a temperature of about 120° C. to about 150° C. by a heater 150. Particularly, the processing liquid 20 heated to the first temperature may be supplied onto the substrate 10 heated to the second temperature.

The substrate 10 may be rotated at a first speed, for example, at a speed of several to several hundred RPM within a range in which the processing liquid 20 does not flow down to a side surface of the substrate 10, and thus the processing liquid 20 may be sufficiently spread on the substrate 10. In particular, the liquid layer may be maintained by surface tension of the processing liquid 20 even while the substrate 10 is rotated at the first speed.

In step S110, a material on the substrate 10 may be removed from the substrate 10 by a reaction between the material and the processing liquid 20. In step S120, a size distribution of by-product particles formed by a reaction between the material and the processing liquid 20 may be measured by a first measurement unit 160. In the step S110, the substrate 10 may be rotated at a speed of several to several hundred RPM by a rotation driving section 120 within a range in which the liquid layer is maintained. Alternatively, a rotation speed of the substrate 10 may be repeatedly accelerated and decelerated between a first speed and a second speed within a range in which the liquid layer is maintained in the step S110, and thus the by-product particles may be prevented from being reattached on the substrate 10. Further, after the processing liquid 20 is supplied onto the substrate 10, the substrate 10 may be heated by the heater 150 to a third temperature, for example, to a temperature of about 200° C. to about 250° C. in the step S110 in order to increase a reaction speed between the material and the processing liquid 20.

In step S130, a supply of the processing liquid 20 may be controlled by a control unit 104 based on the size distribution of the by-product particles. For example, as shown in FIG. 7, in step S132, the control unit 104 may calculate an average size of the by-product particles from the size distribution of the by-product particles. In step S134, when the average size of the by-product particles is greater than a predetermined first size and smaller than a predetermined second size, for example, when the average size of the by-product particles is more than a few hundred nm and less than several μm, the water may be replenished on the substrate 10.

Although not shown in figures, before performing the step S134, the substrate 10 may be cooled to a temperature lower than the boiling point of the water, for example, to a temperature of about 90° C. to about 99° C. by a substrate cooling section 156, and the water may then be replenished on the substrate 10.

The water may be heated to a temperature of about 90° C. to about 99° C. by a water heating unit 146, and may then be supplied onto the substrate 10 through a water supply nozzle 142. In this case, the control unit 104 may control operations of a water supply section 140 based on a thickness of the liquid layer measured by a second measurement unit 166.

For example, the water supply section 140 may supply the water onto the substrate 10 until the thickness of the liquid layer on the substrate 10 reaches a predetermined thickness. In particular, while the water is supplied, the rotation driving section 120 may rotate the substrate 10 at a low speed within a range in which the liquid layer is maintained in order to mix the processing liquid 20 and the water on the substrate 10. Alternatively, the rotation driving section 120 may rotate the substrate 10 to mix the processing liquid 20 and the water on the substrate 10, and the control unit 104 may control operations of the rotation driving section 120 so that a rotational speed of the substrate 10 repeats acceleration and deceleration.

After the water is supplied, the substrate 10 may be reheated to the third temperature by the heater 150.

In step S136, when the average size of the by-product particles is more than a predetermined size, for example, when the average size of the by-product particles is several μm or more, the rotation driving section 120 may rotate the substrate 10 so as to remove the liquid layer and the by-product particles from the substrate 10.

Although not shown in figures, the substrate cooling section 156 may cool the substrate 10 to the second temperature, and in step S138, the processing liquid supply section 130 may supply the processing liquid 20 onto the substrate 10 to form a second liquid layer.

After the second liquid layer is formed, the substrate 10 may be heated to the third temperature by the heater 150. After the material on the substrate 10 is sufficiently removed, in step S140, the substrate 10 may be cooled by the substrate cooling section 156, and the rotation driving section 120 may rotate the substrate 10 at a high speed to remove the processing liquid 20 and by-product particles on the substrate 10.

In accordance with the embodiments of the present invention, the processing liquid supply section 130 may supply the processing liquid 20 on the substrate 10 to form a liquid layer having a predetermined thickness, and the material on the substrate 10 may be removed from the substrate 10 by reaction with the processing liquid 20. As described above, the etching process on the material may be performed in a puddle method, and the amount of use of the processing liquid 20 may thus be significantly reduced. In particular, the supply of the processing liquid 20 may be controlled based on the size distribution of the by-product particles formed in the liquid layer as the etching process on the material is performed, and the etch uniformity for the material may thus be significantly improved.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

The invention claimed is:

1. A substrate processing method comprising:
heating a processing liquid including a chemical liquid and water to a predetermined first temperature higher than a boiling point of the water;
heating a substrate to a predetermined second temperature higher than the boiling point of the water;
supplying the processing liquid heated to the predetermined first temperature on the substrate heated to the predetermined second temperature in order to etch a material on the substrate so that a liquid layer maintained by surface tension is formed on the substrate;
etching the material from the substrate using a chemical reaction between the material and the processing liquid;
measuring a size distribution of by-product particles on a surface of the substrate formed by the chemical reaction between the material and the processing liquid; and
controlling a supply of the processing liquid based on the size distribution of the by-product particles,
wherein the controlling the supply of the processing liquid includes:
calculating an average size of the by-product particles from the size distribution of the by-product particles on the surface of the substrate;
cooling the substrate to a temperature lower than the boiling point of the water when the average size of the by-product particles is greater than a predetermined first size and smaller than a predetermined second size; and
replenishing the water on the substrate cooled to the temperature lower than the boiling point of the water.

2. The substrate processing method of claim 1, wherein the size distribution of the by-product particles on the surface of the substrate is measured by dynamic light scattering.

3. The substrate processing method of claim 1, wherein the controlling the supply of the processing liquid further comprises:

removing the liquid layer on the substrate when the average size of the by-product particles is greater than or equal to the predetermined second size; and supplying the processing liquid on the substrate to form a second liquid layer.

4. The substrate processing method of claim 1, wherein the controlling the supply of the processing liquid further comprises:

measuring a thickness of the liquid layer, wherein the water is replenished so that the thickness of the liquid layer becomes a predetermined thickness.

5. The substrate processing method of claim 1, wherein the substrate is rotated at a first speed within a range in which the liquid layer is maintained while etching the material.

6. The substrate processing method of claim 1, wherein the substrate is rotated within a range in which the liquid layer is maintained while etching the material, and a rotational speed of the substrate repeats acceleration and deceleration between a first speed and a second speed.

7. The substrate processing method of claim 1, wherein the etching the material from the substrate comprises:

heating the substrate to a predetermined third temperature higher than the predetermined second temperature after the processing liquid is supplied onto the substrate.

8. The substrate processing method of claim 7, wherein the controlling the supply of the processing liquid further comprises:

cooling the substrate to the second temperature when the average size of the by-product particles is greater than or equal to the predetermined second size;

rotating the substrate so that the liquid layer on the substrate is removed; and supplying the processing liquid on the substrate to form the second liquid layer.

9. The substrate processing method of claim 1, wherein the substrate is rotated at a first speed within a range in which the liquid layer is maintained while the water is replenished.

10. The substrate processing method of claim 1, wherein the substrate is rotated within a range in which the liquid layer is maintained while the water is replenished; and a rotational speed of the substrate repeats acceleration and deceleration between a first speed and a second speed.

* * * * *